US007902608B2

(12) United States Patent
Anderson et al.

(10) Patent No.: US 7,902,608 B2
(45) Date of Patent: Mar. 8, 2011

(54) INTEGRATED CIRCUIT DEVICE WITH DEEP TRENCH ISOLATION REGIONS FOR ALL INTER-WELL AND INTRA-WELL ISOLATION AND WITH A SHARED CONTACT TO A JUNCTION BETWEEN ADJACENT DEVICE DIFFUSION REGIONS AND AN UNDERLYING FLOATING WELL SECTION

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 12/473,324

(22) Filed: May 28, 2009

(65) Prior Publication Data

US 2010/0301419 A1    Dec. 2, 2010

(51) Int. Cl.
*H01L 29/772* (2006.01)
*H01L 21/70* (2006.01)

(52) U.S. Cl. .......... 257/368; 257/E21.661; 257/E27.098; 438/197

(58) Field of Classification Search .................. 257/213, 257/288, 368–401, E21.661, E27.098, E27.099, 257/E27.1, E27.101; 438/142, 197–233
See application file for complete search history.

(56) References Cited

U.S. PATENT DOCUMENTS

| | | |
|---|---|---|
| 4,994,406 A | 2/1991 | Vasquez et al. |
| 5,843,816 A | 12/1998 | Liaw et al. |
| 5,930,107 A | 7/1999 | Rajeevakumar |
| 5,930,633 A | 7/1999 | Liaw |
| 6,057,186 A | 5/2000 | Chang et al. |
| 6,232,202 B1 | 5/2001 | Hong |
| 6,297,127 B1 | 10/2001 | Chen et al. |
| 6,303,413 B1 | 10/2001 | Kalnitsky et al. |
| 6,624,459 B1 * | 9/2003 | Dachtera et al. .............. 257/296 |
| 6,661,049 B2 | 12/2003 | Tzeng et al. |
| 6,667,226 B2 | 12/2003 | Pinto et al. |
| 6,833,602 B1 | 12/2004 | Mehta |
| 6,864,151 B2 | 3/2005 | Yan et al. |

(Continued)

OTHER PUBLICATIONS

Bryant et al., U.S. Appl. No. 12/111,266, filed Apr. 29, 2008.

*Primary Examiner* — Minh-Loan T Tran
*Assistant Examiner* — Kevin Quinto
(74) *Attorney, Agent, or Firm* — Gibb I.P. Law Firm, LLC; Richard M. Kotulak, Esq.

(57) ABSTRACT

Disclosed are embodiments of an improved integrated circuit device structure (e.g., a static random access memory array structure or other integrated circuit device structure incorporating both P-type and N-type devices) and a method of forming the structure that uses DTI regions for all inter-well and intra-well isolation and, thereby provides a low-cost isolation scheme that avoids FET width variations due to STI-DTI misalignment. Furthermore, because the DTI regions used for intra-well isolation effectively create some floating well sections, which must each be connected to a supply voltage (e.g., Vdd) to prevent threshold voltage (Vt) variations, the disclosed integrated circuit device also includes a shared contact to a junction between the diffusion regions of adjacent devices and an underlying floating well section. This shared contact eliminates the cost and area penalties that would be incurred if a discrete supply voltage contact was required for each floating well section.

25 Claims, 8 Drawing Sheets

U.S. PATENT DOCUMENTS

| | | |
|---|---|---|
| 7,009,237 B2 | 3/2006 | Adkisson et al. |
| 7,019,348 B2 | 3/2006 | Tu |
| 7,042,044 B2 | 5/2006 | Wu |
| 7,282,771 B2 | 10/2007 | Voldman |
| 2005/0106836 A1 | 5/2005 | Chen et al. |
| 2007/0145519 A1 | 6/2007 | Peng et al. |
| 2007/0187769 A1 | 8/2007 | Anderson et al. |
| 2007/0243671 A1 | 10/2007 | Liaw |

* cited by examiner

INTEGRATED CIRCUIT DEVICE WITH DEEP TRENCH ISOLATION REGIONS FOR ALL INTER-WELL AND INTRA-WELL ISOLATION AND WITH A SHARED CONTACT TO A JUNCTION BETWEEN ADJACENT DEVICE DIFFUSION REGIONS AND AN UNDERLYING FLOATING WELL SECTION

BACKGROUND

1. Field of the Invention

The embodiments of the invention generally relate to integrated circuit devices and, more specifically, to an integrated circuit device (e.g., a static random access memory (SRAM) array) and method of forming the device with deep trench isolation regions for all inter-well and intra-well isolation and with a shared contact to a junction between adjacent device diffusion regions and an underlying floating well section.

2. Description of the Related Art

Integrated circuit devices, such as static random access memory (SRAM) arrays or other devices that incorporate both P-type field effect transistors (PFETs) and N-type field effect transistors (NFETs), can be formed on various different types of substrates (e.g., on silicon-on-insulator (SOI) wafers, bulk wafers or hybrid orientation (HOT) wafers). One technique for forming an integrated circuit device on a bulk semiconductor wafer (e.g., a P-wafer) requires implantation of N+ and P+ well regions at the top surface of a bulk wafer prior to epitaxially growing a semiconductor layer. Then, within the epitaxially grown semiconductor layer, PFETs are formed above the N+ well regions and NFETs are formed above the P+ well regions such that the P+ and N+ well regions, respectively, electrically isolate the NFETs and the PFETs from the bulk substrate. Conventionally, shallow trench isolation (STI) regions are used for any required intra-well isolation (i.e., isolation between same conductivity type FETs) and dual depth trench isolation (DDTI) regions, which include deep trench isolation (DTI) regions extending into the substrate below the level of the wells, are used for inter-well isolation (i.e., isolation between different conductivity type FETs). However, having both STI and DDTI regions can be expensive.

SUMMARY

In view of the foregoing, disclosed herein are embodiments of an improved integrated circuit device structure (e.g., a static random access memory (SRAM) array structure or other integrated circuit device structure incorporating both P-type and N-type devices) and a method of forming the structure that uses deep trench isolation (DTI) regions for all inter-well and intra-well isolation and, thereby provides a low-cost isolation scheme. Because only DDTI regions are used for inter-well and intra-well isolation, the embodiments avoid FET width variations due to shallow trench isolation (STI)-DTI misalignment and, thereby avoid threshold voltage variations that can impact performance. Furthermore, because the DTI regions used for intra-well isolation effectively create some floating well sections (i.e., isolated well sections), which must each be connected to a supply voltage (e.g., Vdd) to prevent threshold voltage (Vt) variations, the disclosed integrated circuit device also includes a shared contact to a junction between the diffusion regions of adjacent devices and an underlying floating well section. This shared contact eliminates the cost and area penalties that would be incurred if a discrete supply voltage contact was required for each floating well section.

More particularly, disclosed herein are embodiments of an integrated circuit device structure. This structure can comprise a substrate, having a first conductivity type, and further comprising a well, having a second conductivity type different from the first conductivity type. A semiconductor layer (e.g., an epitaxial silicon layer) can be positioned on the substrate. This semiconductor layer can comprise a device region located above the well and, more particularly, above a floating section of the well. The device region can be defined on opposing sides and opposing ends by deep trench isolation (DTI) regions extending into the substrate below the maximum depth of the well.

Within the device region, the semiconductor layer can comprise a first diffusion region for a first device and a second diffusion region for a second device. The first and second diffusion regions can each have the first conductivity type. Additionally, within the device region, the semiconductor layer can also comprise a third diffusion region positioned laterally between the first and second diffusion regions. This third diffusion region can have the second conductivity type and can extend vertically to the underlying floating well section. A conductor layer (e.g., a silicide layer) can be positioned on the semiconductor layer and, specifically, can extend laterally over and can contact the first diffusion region, the third diffusion region and the second diffusion region such that a junction between the first diffusion region, the underlying floating well section and the second diffusion region is created. Thus, a single shared contact to the conductor layer at this junction can electrically connect the first diffusion region of the first device, the second diffusion region of the second device and the underlying floating well section to a supply voltage (e.g., a positive supply voltage (Vdd)).

In one exemplary embodiment, the integrated circuit device structure can comprise a static random access memory (SRAM) array structure. The SRAM array can be formed on a substrate having a first conductivity type. The substrate can comprise a well having the second conductivity type. A semiconductor layer (e.g., an epitaxial silicon layer) can be positioned on the substrate. Deep trench isolation (DTI) regions can extend into the substrate to below the maximum depth of the well so as to define opposing sides and ends of device regions for memory cells in the array. One of these device regions can be located above the well and, more particularly, above a floating section of the well.

Within this device region, the semiconductor layer can comprise a first source region for a first pull-up field effect transistor of a first memory cell and a second source region for a second pull-up field effect transistor for a second memory cell. The first source region and the second source region can have the first conductivity type. Additionally, within the device region, the semiconductor layer can also comprise a doped region positioned laterally between the first source region and the second source region. The doped region can have the second conductivity type and can further extend vertically to the underlying floating well section. A conductor layer (e.g., a silicide layer) can be positioned on the semiconductor layer and, specifically, can extend laterally over and can contact the first source region, the doped region and the second source region such that a junction between the first source region, the underlying floating well section and the second source region is created. Thus, a single shared contact to the conductor layer at this junction can electrically connect the first source region of the first pull-up field effect transistor, the second source region of the second pull-up field effect transistor and the underlying floating well section to a supply voltage (e.g., a positive supply voltage (Vdd)).

It should be noted that, since bulk silicon wafers typically have a P-conductivity type, the "first conductivity type" referred to above will typically comprise a P-type conductivity and the "second conductivity type" referred to above will typically comprise an N-type conductivity.

Thus, in an exemplary SRAM array the substrate can comprise a P-substrate. An N+ well can be located in the P-substrate and, more particularly, at the top surface of the P-substrate. A semiconductor layer (e.g., an epitaxial silicon layer) can be positioned on the P-substrate. Deep trench isolation regions can extend through the semiconductor layer into the P-substrate to below the N+ well so as to define device regions of memory cells in the array. One of these device regions can comprise a section of the semiconductor layer above a corresponding floating section of the N+ well. This section of the semiconductor layer can comprise a first P-type source region for a first P-type pull-up field effect transistor of a first memory cell and a second P-type source region for a second P-type pull-up field effect transistor of a second memory cell, which is positioned adjacent the first memory cell. Additionally, this section of the semiconductor layer can also comprise an N-type doped region positioned laterally between the first P-type source region and the second P-type source region. The N-type doped region can further extend vertically down to the floating section of the N+ well. A conductor layer (e.g., a silicide layer) can be positioned on the semiconductor layer. This conductor layer can extend laterally over and can contact the first P-type source region, the N-type doped region and the second P-type source region such that a junction between the first P-type source region, the floating section of the N+ well and the second P-type source region is created. Thus, a single shared contact on the conductor layer at this junction can electrically connect the source regions of the P-type pull-up field effect transistors and also the underlying N-type floating well section to a positive supply voltage (Vdd).

However, while the embodiments are described above with the first conductivity type being a P-type conductivity and the second conductivity type being an N-type conductivity, it is anticipated that, in the alternative, the first conductivity type could comprise an N-type conductivity and the second conductivity type could comprise a P-type conductivity.

Also, disclosed herein are embodiments of a method of forming the above described integrated circuit device and the above-described SRAM array. Specifically, one embodiment of the method can comprise forming an integrated circuit device. This embodiment can comprise providing a substrate having a first conductivity type. A well, having a second conductivity type different from the first conductivity type, can be formed in the substrate and, particularly, at the top surface of the substrate. Then, after the well is formed, a semiconductor layer can be formed on the substrate (e.g., by epitaxially growing a silicon layer). Next, deep trench isolation regions can be formed that extend through the semiconductor layer and down into the substrate below the maximum depth of the well in order to define device regions in the semiconductor layer: one specific device region being a designated region, above a floating section of the well, for a first device and a second device.

Once the device regions are defined, the first device and second device can be formed in the specific device region. The first and second devices, however, can be formed specifically so that a junction is formed between a first diffusion region of the first device, a second diffusion region of the second device and also the underlying floating well section. To accomplish this, the first diffusion region and the second diffusion region are formed in the semiconductor layer such that the first diffusion region and the second diffusion region have the first conductivity type. Additionally, a third diffusion region can be formed in the semiconductor layer such that it is positioned laterally between the first diffusion region and the second diffusion region, such that it has the second conductivity type and further such that it extends vertically to the underlying floating well section. Then, a conductor layer can be formed (e.g., a silicide layer is formed) on the semiconductor layer such that it extends laterally over and contacts the first diffusion region, the third diffusion region and the second diffusion region. Subsequently, a single contact can be formed on the conductor layer and electrically connected to a supply voltage.

One exemplary embodiment of this method can comprise forming a static random access memory (SRAM) array. This embodiment can similarly comprise providing a substrate having a first conductivity type. A well, having a second conductivity type different from the first conductivity type, can be formed in the substrate and, particularly, at the top surface of the substrate. Then, after the well is formed, a semiconductor layer can be formed on the substrate (e.g., by epitaxially growing a silicon layer). Next, deep trench isolation regions can be formed that extend through the semiconductor layer and down into the substrate below the maximum depth of the well in order to define device regions in the semiconductor layer: one specific device region being a designated region, above a floating section of the well, for a first pull-up field effect transistor in a node of a first memory cell and a second pull-up field effect transistor in a node of a second adjacent memory cell.

Once the device regions are defined, the first pull-up field effect transistor and the second pull-up field effect transistor can be formed in the specific device region. The first and second pull-up field effect transistors, however, can be formed specifically so that a junction is formed between a first source region of the first pull-up field effect transistor, a second source region of the second pull-up field effect transistor and also the underlying floating well section. To accomplish this, the first source region and the second source region are formed in the semiconductor layer such that the first source region and the second source region have the first conductivity type. Additionally, another doped region can be formed in the semiconductor layer such that it is positioned laterally between the first source region and the second source region, such that it has the second conductivity type and further such that it extends vertically to the floating well section. Then, a conductor layer is formed (e.g., a silicide layer is formed) on the semiconductor layer such that the conductor layer extends laterally over and contacts the first source region, the doped region and the second source region. Subsequently, a single contact can be formed on the conductor layer and electrically connected to a positive supply voltage (Vdd).

It should be noted that, since bulk wafers typically have a P-conductivity type, the "first conductivity type" referred to above will typically comprise a P-type conductivity and the "second conductivity type" referred to above will typically comprise an N-type conductivity. However, it is anticipated that, in the alternative, the first conductivity type could comprise an N-type conductivity and the second conductivity type could comprise a P-type conductivity.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

Figure 1:
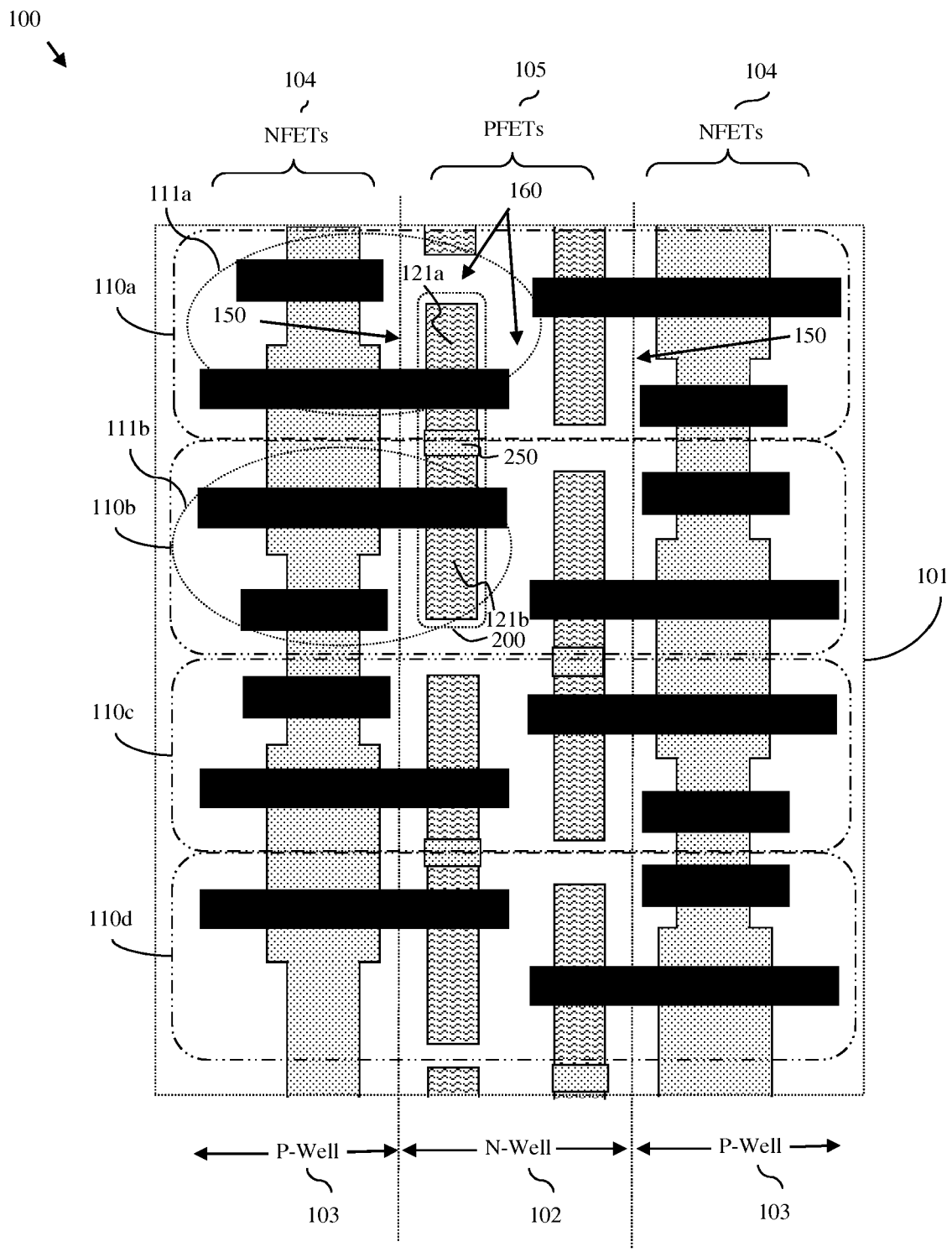
FIG. 1 is a top plan view diagram illustrating an embodiment of an integrated circuit device structure 100, such as a static random access memory (SRAM) array structure, according to the present invention.

The embodiments of the invention and the various features and advantageous details thereof are explained more fully with reference to the non-limiting embodiments that are illustrated in the accompanying drawings and detailed in the following description.

As mentioned above, integrated circuit devices, such as static random access memory (SRAM) arrays or other devices that incorporate both P-type field effect transistors (PFETs) and N-type field effect transistors (NFETs), can be formed on various different types of substrates (e.g., on silicon-on-insulator (SOI) wafers, bulk wafers or hybrid orientation (HOT) wafers). One technique for forming an integrated circuit device on a bulk semiconductor wafer (e.g., a P-wafer) requires implantation of N+ and P+ well regions at the top surface of a bulk wafer prior to epitaxially growing a semiconductor layer. Then, within the epitaxially grown semiconductor layer, PFETs are formed above the N+ well regions and NFETs are formed above the P+ well regions such that the P+ and N+ well regions, respectively, electrically isolate the NFETs and the PFETs from the bulk substrate. Conventionally, shallow trench isolation (STI) regions are used for any required intra-well isolation (i.e., isolation between same conductivity type FETs) and dual depth trench isolation (DDTI) regions, which include deep trench isolation (DTI) regions extending into the substrate below the level of the wells, are used for inter-well isolation (i.e., isolation between different conductivity type FETs). Thus, this isolation scheme results in any field effect transistors, which are positioned adjacent to an N+ well-P+ well interface, being bounded on one side by an STI region and bounded on the opposite side by a DDTI region. Unfortunately, during formation, the different type isolation regions (i.e., STI and DDTI) can be misaligned resulting in FET width variations, which in turn can impact device performance because the threshold voltage (Vt) of narrow FETs, such as those incorporated into SRAM arrays, is very sensitive to FET width variations.

Therefore, there is a need in the art for an improved integrated circuit device structure and method of forming the structure that avoids the above-mentioned conventional isolation scheme and, thereby, avoids Vt variations resulting from FET width variations. One such integrated circuit device structure and, more particularly, an SRAM array structure is disclosed in U.S. patent application Ser. No. 12/111,266, filed on Apr. 29, 2008, assigned to International Business Machines Corporation of Armonk, N.Y., and incorporated herein in its entirety by reference. In the SRAM array structure of U.S. patent application Ser. No. 12/111,266, continuous parallel DTI regions running in a first direction are used, not only for inter-well isolation (i.e., isolation regions extending into the substrate below the level of the wells to provide isolation between different conductivity type FETs), but also for some intra-well isolation (i.e., isolation regions extending between some same-type FETs, and, particularly, between PFETs in different nodes of the same memory cell). This structure solves the FET width variation problem occurring with FETs that are positioned adjacent to an N+ well-P+ well interface, as such FETs are no longer bounded on one side by an STI region and bounded on the opposite side by a DDTI region, but rather bounded on both sides by a DTI region. However, in the structure of U.S. patent application Ser. No. 12/111,266, STI regions are still used between the parallel, single direction, DTI regions for providing additional intra-well isolation, for example, between pull-up PFETs of adjacent memory cells. Unfortunately, the cost of forming both DTI and STI can be high.

In view of the foregoing, disclosed herein are embodiments of an improved integrated circuit device structure (e.g., a static random access memory (SRAM) array structure or other integrated circuit device structure incorporating both P-type and N-type devices) and a method of forming the structure that uses deep trench isolation (DTI) regions for all inter-well and intra-well isolation and, thereby provides a low-cost isolation scheme that avoids FET width variations due to shallow trench isolation (STI)-DTI misalignment. Furthermore, because the DTI regions used for intra-well isolation effectively create some floating well sections (i.e., isolated well sections), which must each be connected to a supply voltage (e.g., Vdd) to prevent threshold voltage (Vt) variations, the disclosed integrated circuit device also includes a shared contact to a junction between the diffusion regions of adjacent devices and an underlying floating well section. This shared contact eliminates the cost and area penalties that would be incurred if a discrete supply voltage contact was required for each floating well section.

More particularly, FIG. 1 shows a top view illustration of an embodiment of an integrated circuit device 100. Referring to FIG. 1, the integrated circuit device 100 can comprise a substrate 101 having a first conductivity type. Wells 102 and 103 having different conductivity types can be located in the substrate 101 and, particularly, at the top surface of the substrate 101. Different conductivity type devices 104, 105 can be positioned above opposite conductivity type wells so as to isolate the devices 104, 105 from the lower portion of the substrate 101. Deep trench isolation (DTI) regions 150, 160 can define multiple device regions (e.g., see device region 200), providing all required inter-well isolation 160 (i.e., isolation between FETs with different conductivity types) and also all required intra-well isolation 150 (i.e., isolation between FETs with the same conductivity type). Additionally, for any floating well section created by the DTI regions 150, 160 (e.g., below device region 200), a shared supply voltage contact can be electrically connected to a junction 250 between diffusion regions of two adjacent devices having the same conductivity type and also an underlying floating well section having a different conductivity type. This junction 250 comprises a structure which allows the supply voltage to be simultaneously applied, through the shared contact, to the diffusion regions of the adjacent devices and to the underlying floating well section.

Specifically, the integrated circuit device 100 can be formed on a substrate 101 having a first conductivity type. The substrate 101 can comprise a well 102 (e.g., a pre-epitaxial growth implant region), having a second conductivity type different from the first conductivity type.

Figure 2:
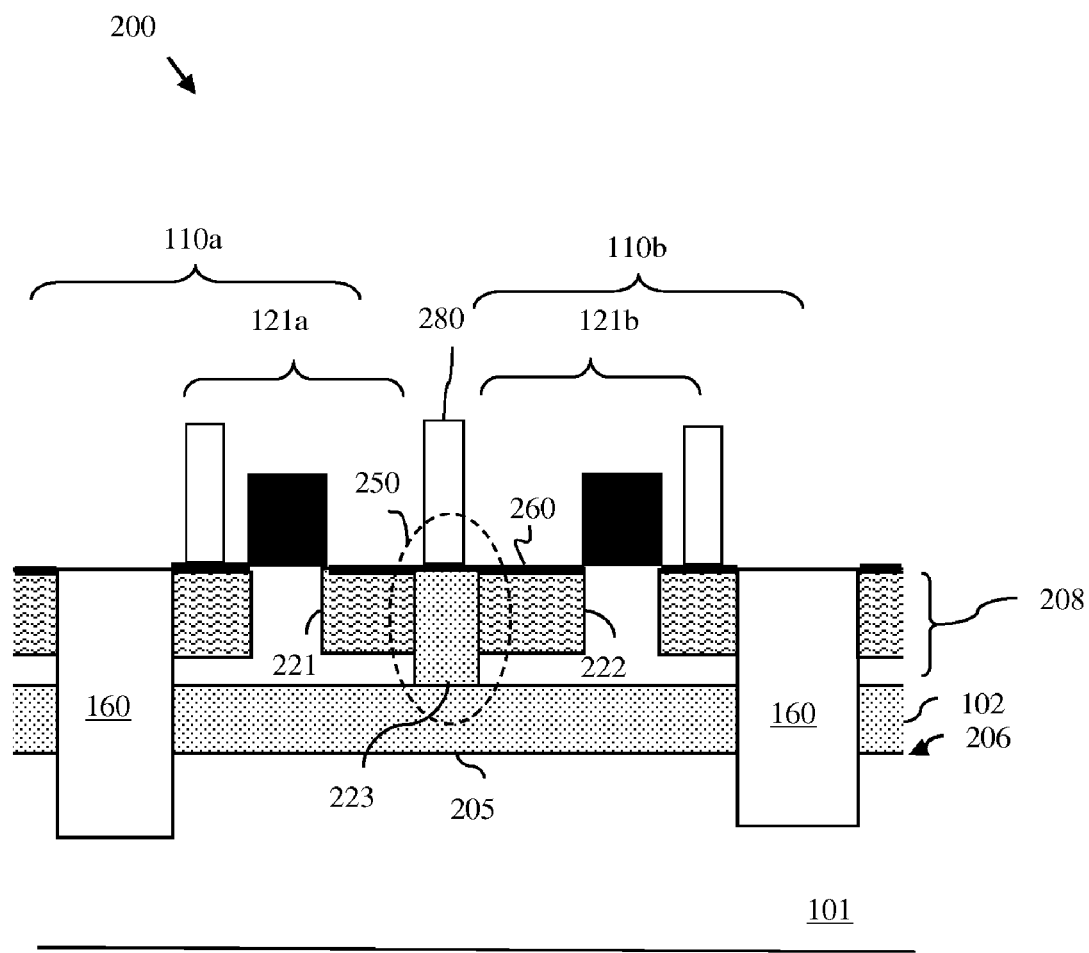
FIG. 2 is a cross-section view diagram illustrating a device region 200 of the structure 100 of FIG. 1.

FIG. 2 shows a cross-section view of a device region 200 of integrated circuit device 100. Referring to FIG. 2 in combination with FIG. 1, a semiconductor layer 208 (e.g., an epitaxial silicon layer) can be positioned on the substrate 101. This semiconductor layer 208 can comprise the device region 200 located above the well 102 and, more particularly, above a floating section 205 of the well 102. The device region 200 can be defined on opposing sides and opposing ends by the deep trench isolation (DTI) regions 160 and 150, which extend into the substrate 101 below the maximum depth 206 of the well 102. The device region 200 can contain a first device 121a and a second device 121b adjacent to the first device 121b. The first and second devices 121a, 121b can have a different conductivity type than the well 102 such that they are isolated from the lower portion of the substrate 101.

More specifically, within the device region 200, the semiconductor layer 208 can comprise at least a first diffusion region 221 for the first device 121a and at least a second diffusion region 222 for the second device 121b. The first and second diffusion regions 221, 222 can each have the first conductivity type. Additionally, within the device region 200, the semiconductor layer 208 can also comprise a third diffusion region 223 positioned laterally between the first and second diffusion regions 221, 222. This third diffusion region 223 can have the second conductivity type and can extend vertically to the floating well section 205. A conductor layer 260 (e.g., a silicide layer) can be positioned on the semiconductor layer 208 and, specifically, can extend laterally over and can contact the first diffusion region 221, the third diffusion region 223 and the second diffusion region 222. The third diffusion region 223 in combination with the conductor layer 260 form a junction 250 between the first diffusion region 221, the floating well section 205 and the second diffusion region 222 is created. That is, the third diffusion region 223 in combination with the conductor layer 260 form a structure that electrically connects (i.e., links, couples, etc.) the first diffusion region 221, the underlying floating well section 205 and the second diffusion region 222. Thus, a single shared contact 280 to the junction 250 and, more particularly, to the conductor layer 260 can electrically connect the first diffusion region 221 of the first device 121a, the second diffusion region 222 of the second device 121b and the underlying floating well section 205 to a supply voltage (e.g., a positive supply voltage (Vdd)). This shared contact 280 eliminates the cost and area penalties that would be incurred if a discrete supply voltage contact was required for each floating well section.

Referring again to FIG. 1, in one exemplary embodiment, the integrated circuit device structure 100 can specifically comprise a static random access memory (SRAM) array structure. The SRAM array 100 can comprise a substrate 101 having a first conductivity type. Wells 102, 103 (e.g., pre-epitaxial growth implant regions) having different conductivity types can be located in the substrate 101 and, particularly, at the top surface of the substrate 101. An array of conventional six-transistor SRAM cells (e.g., see exemplary cells 110a-d) can be formed in a semiconductor layer (e.g., an epitaxial silicon layer) above the wells 102, 103.

Figure 3:
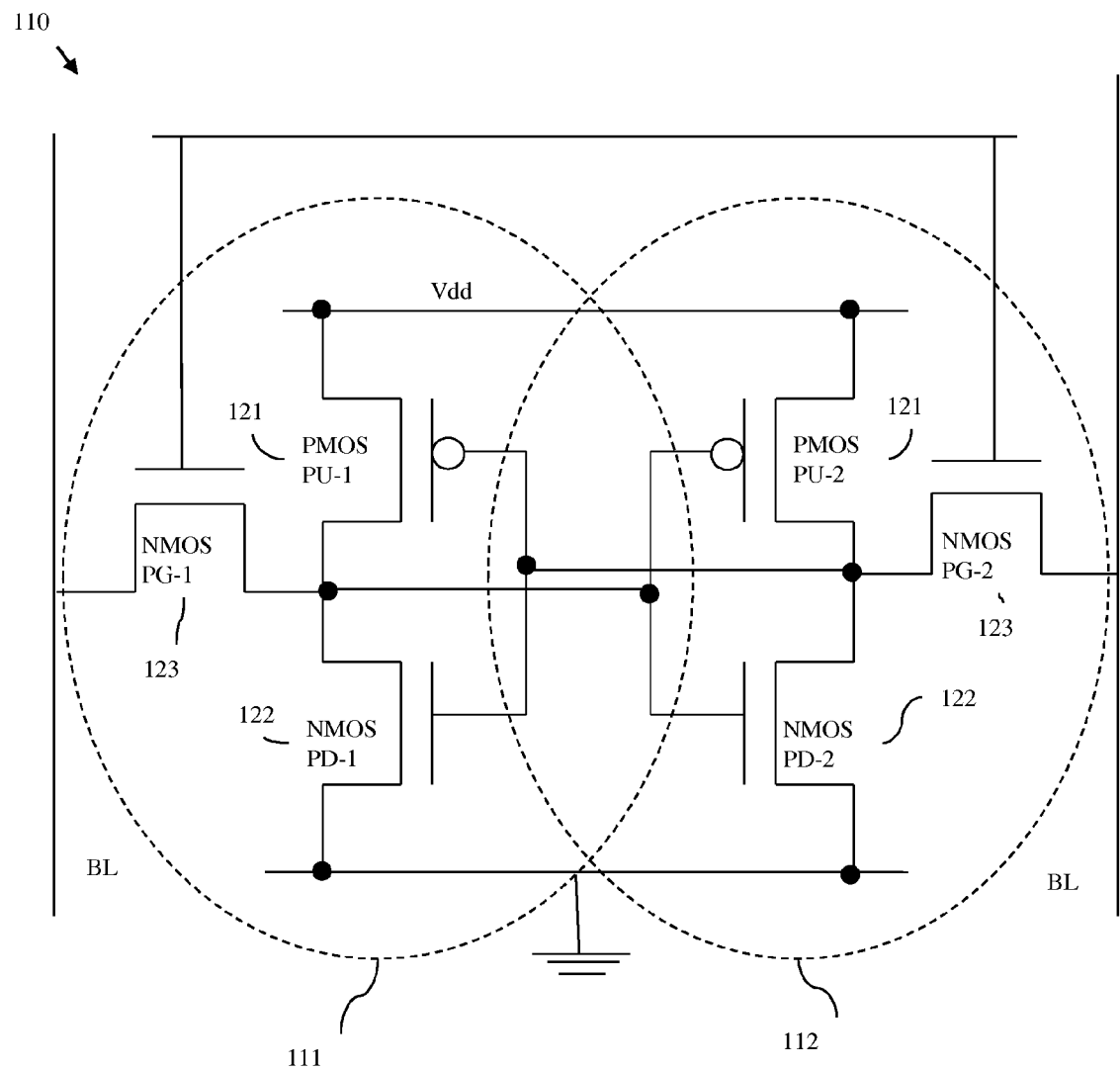
FIG. 3 is a schematic diagram illustrating an exemplary static random access memory (SRAM) cell.

FIG. 3 is a schematic diagram illustrating an exemplary SRAM cell 110. Referring to FIG. 3 in combination with FIG. 1, each SRAM cell 110 in the array can comprise two complementary connected nodes 111, 112 and each node 111, 112 can comprise one first conductivity type FET 105 (i.e., a first conductivity type pull-up FET 123) above a second conductivity type well 102 and two second conductivity type FETs 104 (i.e., a second conductivity type pull-down FET 122 and a second conductivity type pass-gate FET 123) above a first conductivity type well 103. In operation because each node 111, 112 is tied to the gate of the pull-up transistor of the other node, the values stored in each node remain complementary. Typically, the electrical connection made between the nodes 111, 112 is via one of the metal wiring levels and optimal device density is achieved by configuring each cell such that it is symmetrical to its adjacent cells. Additionally, deep trench isolation (DTI) regions 150, 160 can define multiple device regions within the array 100, providing all required inter-well isolation 150 (i.e., isolation between FETs with different conductivity types) and also all intra-well isolation 160 (i.e., isolation between FETs with the same conductivity type). For each floating well section created by the DTI regions below a device region containing the pull-up FETs from adjacent memory cells, a shared positive supply voltage contact (i.e., Vdd) can be electrically connected to a junction between the source regions of the pull-up FETs and also the underlying floating well section. This junction comprises a structure which allows the supply voltage to be simultaneously applied, through the shared contact, to the source regions of the adjacent pull-up FETs and to the underlying floating well section.

More specifically, referring to FIG. 2 in combination with FIG. 1, a semiconductor layer 208 (e.g., an epitaxial silicon layer) can be positioned on the substrate 101. Deep trench isolation (DTI) regions 150, 160 can extend into the substrate 101 to below the maximum depth 206 of the well 102 so as to define opposing sides and ends of device regions (e.g., see device region 200) for memory cells 110a-d in the array 100. One of these device regions 200 can be located above the well 102 and, more particularly, above a floating section 205 of the well 102. This device region 200 can contain, for example, a first pull-up field effect transistor 121a for a node 111a for a first memory cell 110a and a second pull-up field effect transistor 121b for a node 111b of a second memory cell 110b adjacent to the first memory cell 110a.

Within the device region 200, the semiconductor layer 208 can comprise a first source region 221 for the first pull-up field effect transistor 121a of the first memory cell 110a and a second source region 222 for the second pull-up field effect transistor 121b for the second memory cell 110b. The first source region 221 and the second source region 222 can have the first conductivity type. Additionally, within the device region 200, the semiconductor layer 208 can also comprise a doped region 223 positioned laterally between the first source region 221 and the second source region 222. The doped region 223 can have the second conductivity type and can further extend vertically to the floating well section 205. A conductor layer 260 (e.g., a silicide layer) can be positioned on the semiconductor layer 208 and, specifically, can extend laterally over and can contact the first source region 221, the doped region 223 and the second source region 222. The doped region 223 in combination with the conductor layer 260 form a junction 250 between the first source region 221, the underlying floating well section 205 and the second source region 222. That is, the doped region 223 in combination with the conductor layer 260 form a structure that electrically connects (i.e., links, couples, etc.) the first diffusion region 221, the underlying floating well section 205 and the second diffusion region 222. Thus, a single shared contact 280 to the junction 250 and, more particularly, to the conductor layer 260 can electrically connect the first source region 221 of the first pull-up field effect transistor 121a, the second source region 222 of the second pull-up field effect transistor 121b and the underlying floating well section 205 to a supply voltage (e.g., a positive supply voltage (Vdd)). This shared contact 280 eliminates the cost and area penalties that would be incurred if a discrete supply voltage contact was required for each floating well section.

It should be noted that, since bulk silicon wafers typically have a P-conductivity type, the "first conductivity type" referred to above will typically comprise a P-type conductivity and the "second conductivity type" referred to above will typically comprise an N-type conductivity.

Thus, in exemplary SRAM array 100 the substrate 101 can comprise a P-substrate 101. An N+ well 102 can be located in the P-substrate 101 and, more particularly, at the top surface of the P-substrate 101. A semiconductor layer 208 (e.g., an epitaxial silicon layer) can be positioned on the P-substrate 101. Deep trench isolation regions 150, 160 can extend through the semiconductor layer 208 into the substrate 101 to below the N+ well 102 so as to define device regions (e.g., see device region 200) of memory cells (e.g., see memory cells 110a-d) in the array 100. One of these device regions 200 can comprise a section of the semiconductor layer 208 above a corresponding floating section 205 of the N+ well 102. This section of the semiconductor layer 208 can comprise at least a first P-type source region 221 for a first P-type pull-up field effect transistor 121a of a first memory cell 110a and a second P-type source region 222 for a second P-type pull-up field effect transistor 121b of a second memory cell 110b, which is positioned adjacent the first memory cell 110a. Additionally, this section of the semiconductor layer 208 can also comprise an N-type doped region 223 positioned laterally between the first P-type source region 221 and the second P-type source region 222. The N-type doped region 223 can further extend vertically to down to the underlying floating section 205 of the N+ well 102. A conductor layer 260 (e.g., a silicide layer) can be positioned on the semiconductor layer 208. This conductor layer 260 can extend laterally over and can contact the first P-type source region 221, the N-type doped region 223 and the second P-type source region 222. The N-type doped region 223 in combination with the conductor layer 260 form a junction 250 between the first P-type source region 221, the underlying floating section 205 of the N+ well 102 and the second P-type source region 222. That is, the N-type doped region 223 in combination with the conductor layer 260 form a structure that electrically connects (i.e., links, couples, etc.) the first P-type source region 221, the underlying floating well section 205 of the N+ well 102 and second P-type source region 222. Thus, a shared single contact 280 to the junction 250 and, more particularly, to the conductor layer 260 can electrically connect the source regions 221, 222 of the pull-up field effect transistors 121a and 121b and also the underlying floating well section 205 to a positive supply voltage (Vdd). This shared contact 280 eliminates the cost and area penalties that would be incurred if a discrete supply voltage contact was required for each floating well section.

However, while the embodiments are described above with the first conductivity type being a P-type conductivity and the second conductivity type being an N-type conductivity, it is anticipated that, in the alternative, the first conductivity type could comprise an N-type conductivity and the second conductivity type could comprise a P-type conductivity.

Those skilled in the art will recognize that P-type and N-type conductivity can be achieved through implantation of appropriately selected dopants. For example, P-type diffusion and well regions can be implanted with a Group III dopant, such as boron (B), whereas N-type diffusion and well regions can be implanted with a Group V dopant, such as arsenic (As), phosphorous (P) or antimony (Sb). Additionally, those skilled in the art will further recognize that the deep trench isolation regions 150, 160 discussed above and illustrated in FIGS. 1 and 2 can comprise, for example, conventional deep trench isolation structures lined (optionally) and filled with one or more non-electrically conductive fill materials (e.g., an oxide fill material, a nitride fill material, an oxynitride fill material, etc.).

Figure 4:
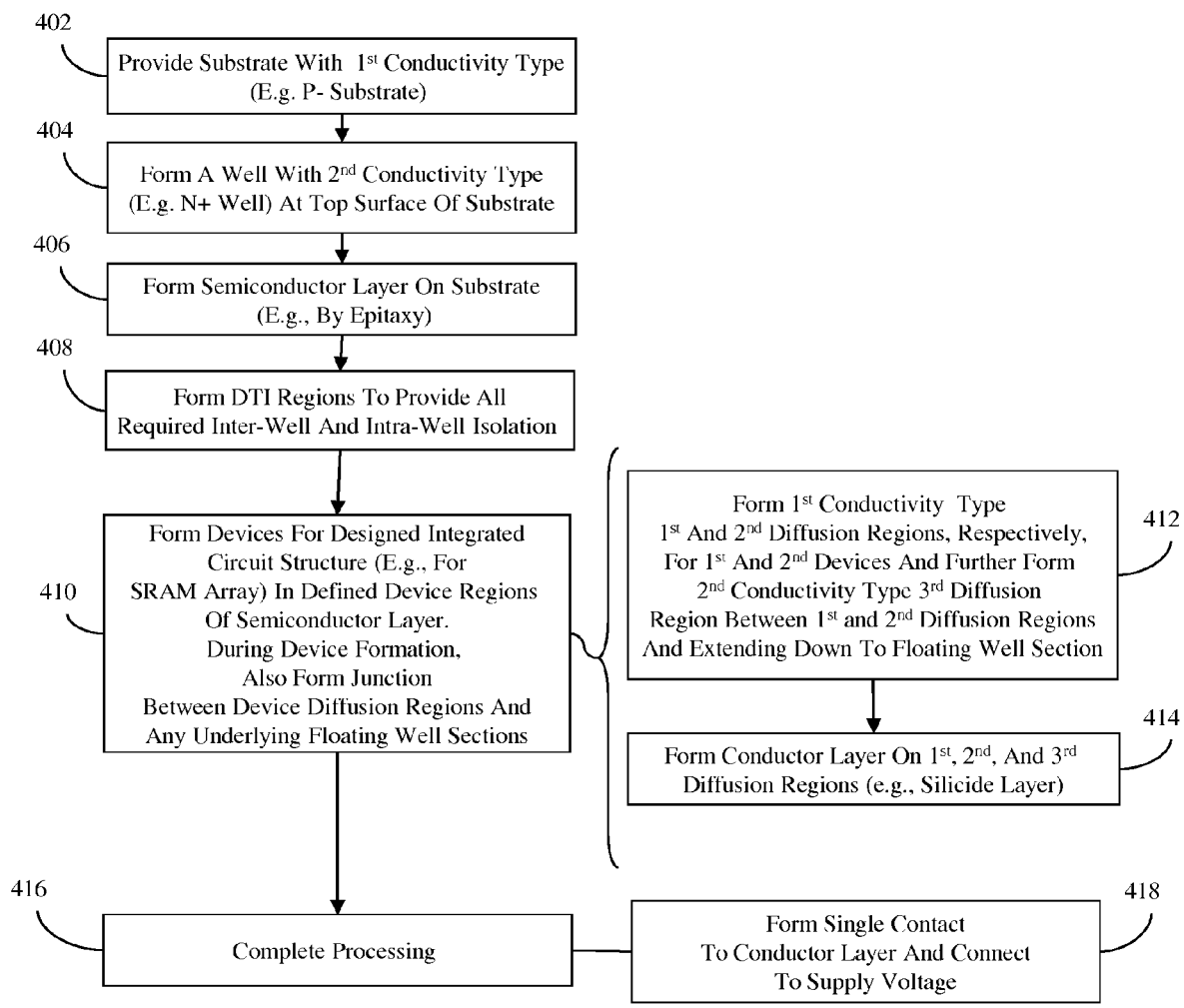
FIG. 4 is a flow diagram illustrating embodiments of a method of forming the structure 100, according to the present invention.
Figure 5:
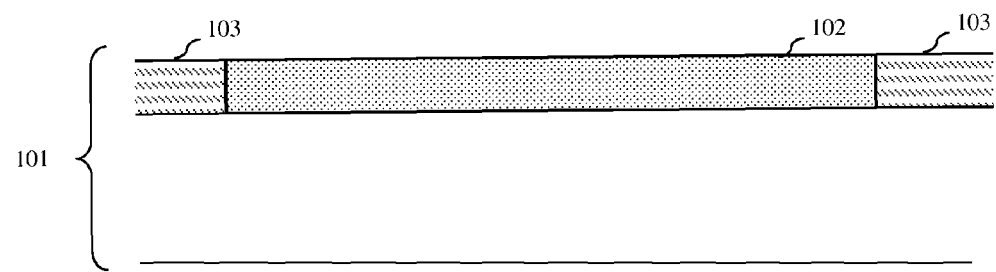
FIG. 5 is a cross-section view diagram illustrating a partially completed structure formed according to the method of FIG. 4.
Figure 6:
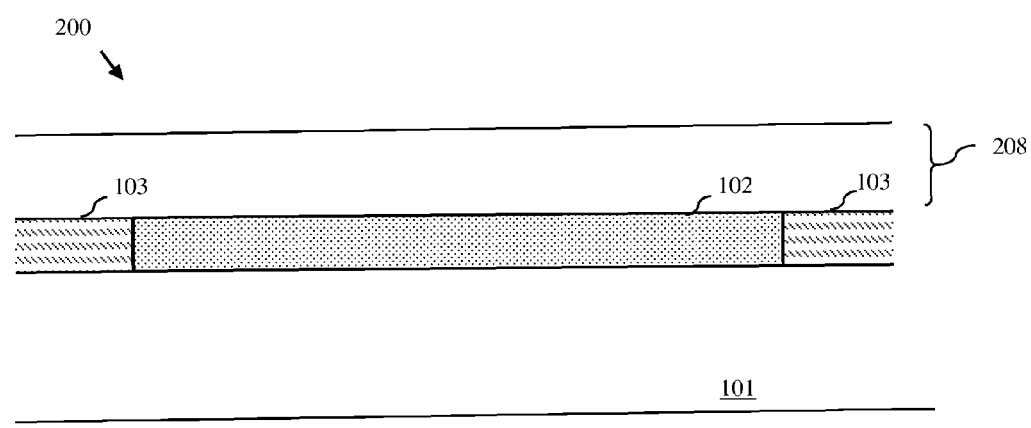
FIG. 6 is a cross-section view diagram illustrating a partially completed structure formed according to the method of FIG. 4.

Also, disclosed herein are embodiments of a method of forming the above described integrated circuit device and the above-described SRAM array. Specifically, referring to FIG. 4, one embodiment of the method can comprise forming an integrated circuit device 100 incorporating both N-type and P-type devices 104, 105, as illustrated in FIG. 1. This embodiment can comprise providing a substrate 101 having a first conductivity type (402). Wells 102 and 103 having different conductivity types can be formed at the top surface of the substrate 101 (404, see FIG. 5). Specifically, wells 102 and 103 can be implanted into the substrate 101 using conventional masked implantation techniques such that well 102, having the second conductivity type, is positioned adjacent one or more wells 103, having the first conductivity type. Then, after the wells 102 and 103 are formed, a semiconductor layer 208 can be formed on the substrate 101 (e.g., by epitaxially growing a silicon layer) (406, see FIG. 6).

Figure 7:
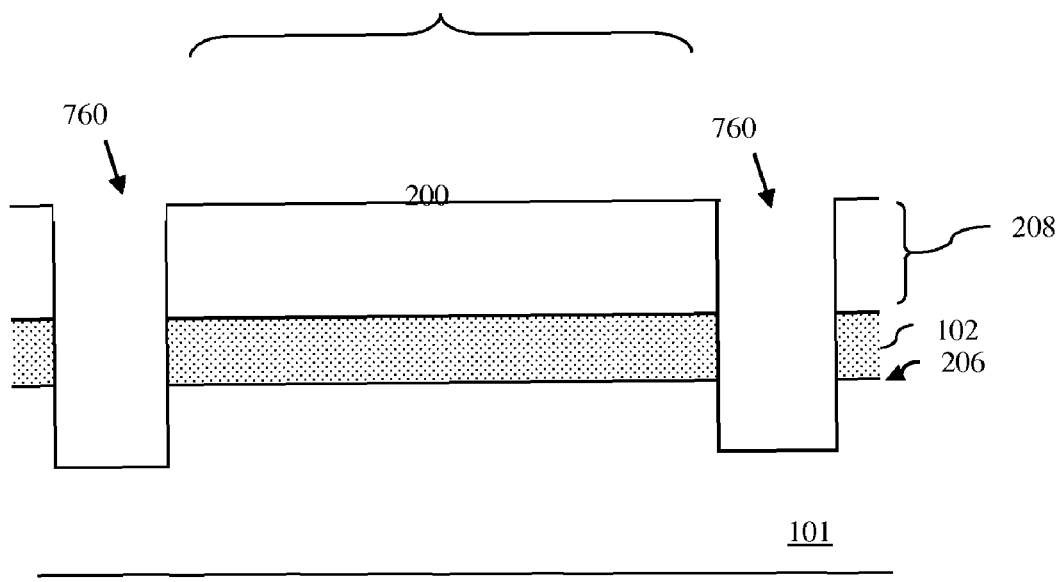
FIG. 7 is a cross-section view diagram illustrating a partially completed structure formed according to the method of FIG. 4.
Figure 8:
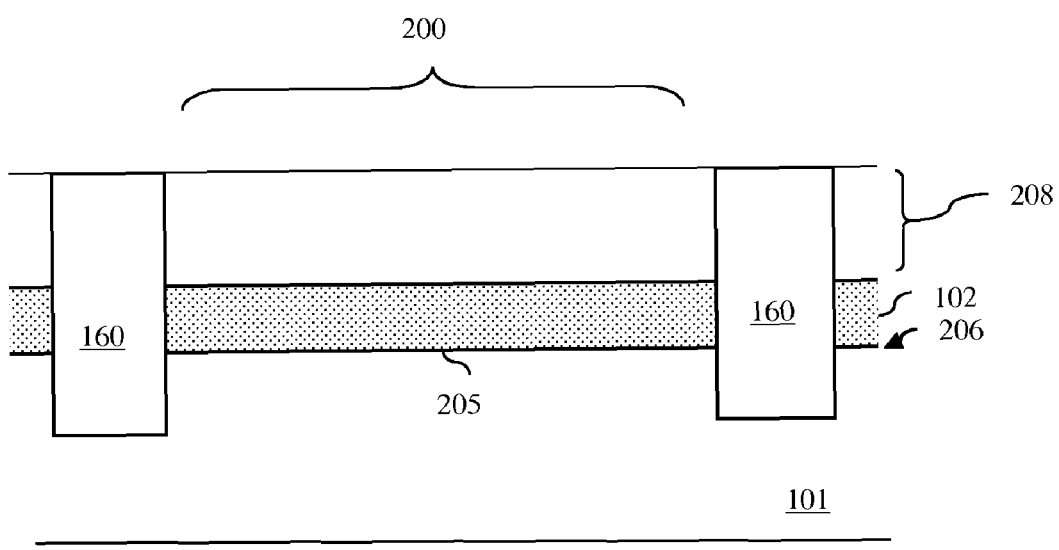
FIG. 8 is a cross-section view diagram illustrating a partially completed structure formed according to the method of FIG. 4.

Next, deep trench isolation regions 150 and 160 can be formed that extend through the semiconductor layer 208 and down into the substrate 101 below the maximum depth of the wells 102 and 103 in order to provide all required inter-well and intra-well isolation for the integrated circuit device 100, thereby defining device regions in the semiconductor layer 208: one specific device region 200 being a designated region above the well 102 for a first device and a second device (408). Such deep trench isolation regions 150, 160 can be formed using conventional techniques. For example, a photoresist layer can be deposited onto the semiconductor layer 208 and patterned. The pattern can then be transferred into the semiconductor layer 208 and substrate 101 using an anisotropic etch process (e.g., a plasma reactive ion etch (RIE) process) to form the trenches 760 (see FIG. 7). The anisotropic etch is continued until the trenches 760 are deeper than the maximum depth 206 of the well 102. After the trenches 760 are formed, they can optionally be lined (e.g., by growing a thin oxide material), filled (e.g., by plasma deposition) with one or more non-electrically conductive fill material (e.g., an oxide fill material, a nitride fill material, an oxynitride fill material, etc.) and then planarized, thereby creating the DTI regions (e.g., see FIG. 8).

Once the device regions are defined, all devices 104, 105 for the integrated circuit structure 100 can be formed (410). Specifically, first conductivity type devices 105 can be formed above the second conductivity type well 102 and second conductivity type devices 104 can be formed above the first conductivity type wells 103 (as shown in FIG. 1). However, during device formation at process 410 and in the case of device regions having an underlying floating well section 205 created by the DTI regions 150, 160 (e.g., see device region 200 in FIG. 8), a junction can also be formed between the diffusion regions of adjacent devices and the underlying floating well section. This junction, as formed, can comprise a structure which allows a supply voltage to be simultaneously applied, through the shared contact, to the diffusion regions of the adjacent devices and to the underlying floating well section.

Figure 9:
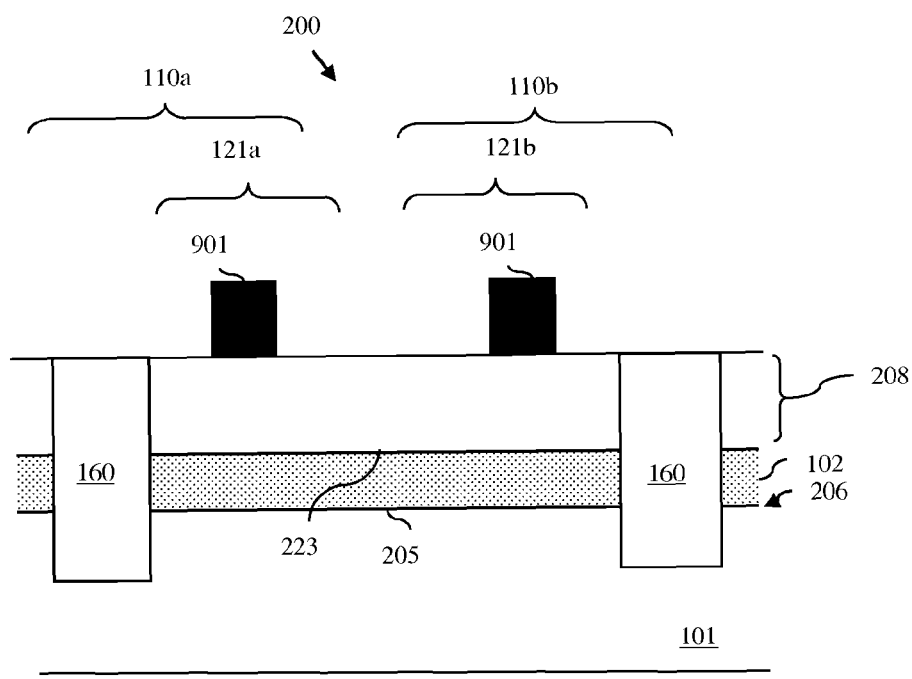
FIG. 9 is a cross-section view diagram illustrating a partially completed structure formed according to the method of FIG. 4.
Figure 10:
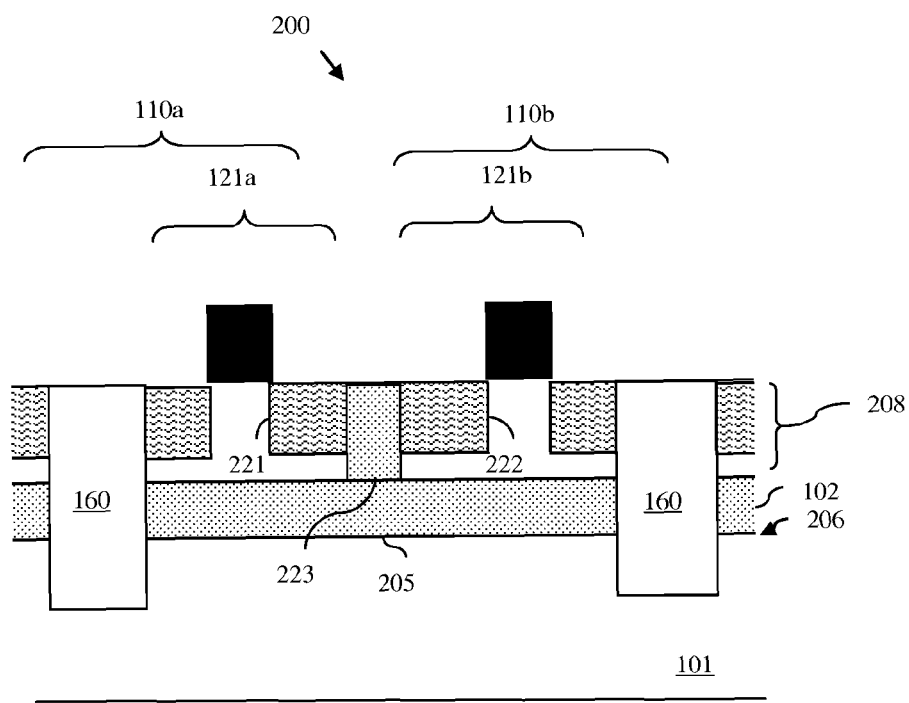
FIG. 10 is a cross-section view diagram illustrating a partially completed structure formed according to the method of FIG. 4.
Figure 11:
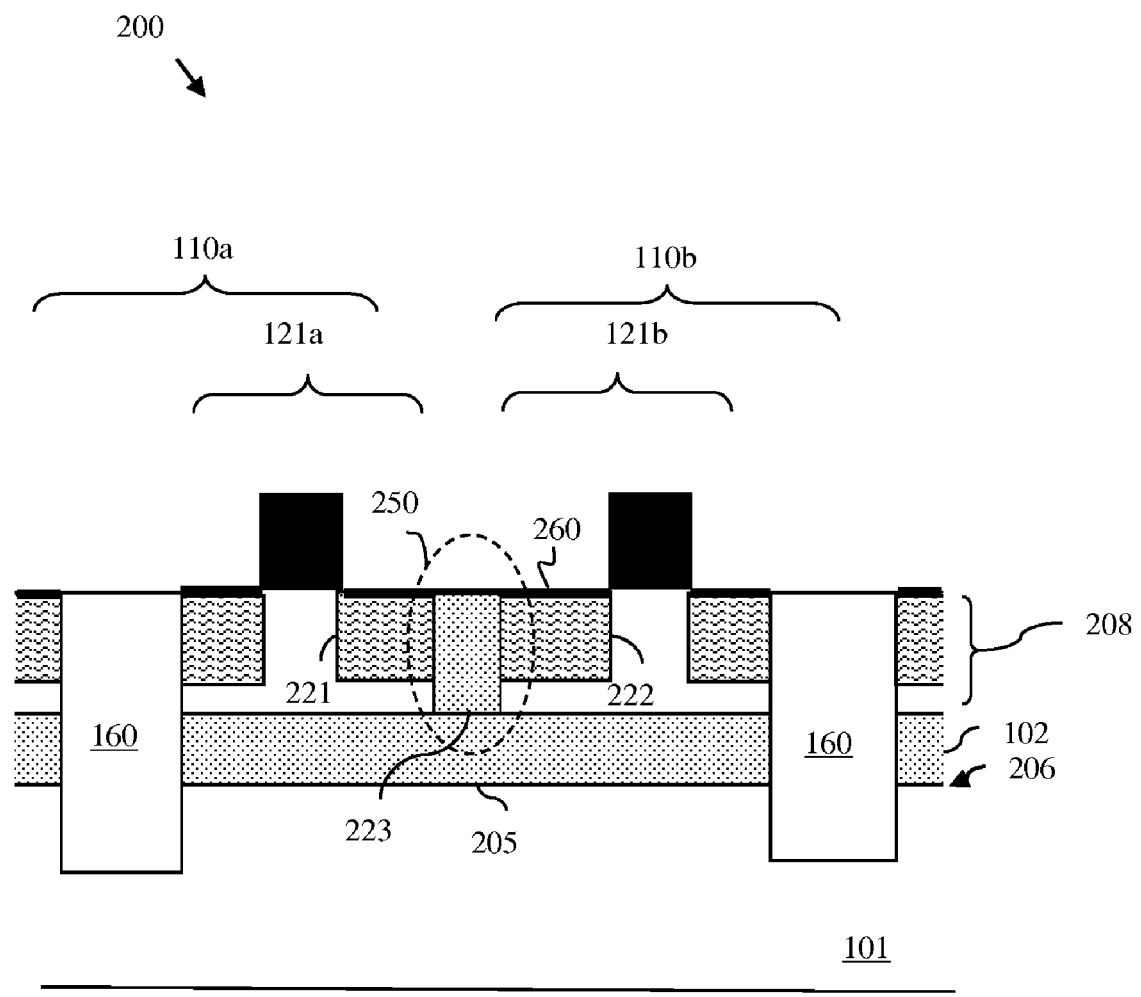
FIG. 11 is a cross-section view diagram illustrating a partially completed structure formed according to the method of FIG. 4.

Specifically, conventional processing techniques can be used to form devices 104 and 105 in the various device regions and, more particularly, to form adjacent devices 121a and 121b in the device region 200. That is, a blanket gate dielectric layer can be deposited on the semiconductor layer and a blanket gate conductor layer can be deposited on the gate dielectric layer. The gate dielectric layer-gate conductor layer stack can be patterned and etched to form gate structures, including but not limited to, gate structures 901 and 902 for adjacent devices 121a and 121b in device region 200 (see FIG. 9). Then, first diffusion regions 221, having the first conductivity type, can be formed in the semiconductor layer 208 on side of the first gate structure 901 for the first device 121a (e.g., by performing a masked implantation process). Simultaneously, second diffusion regions 222, also having the first conductivity type, can be formed in the semiconductor layer 208 on either side of the second gate structure 902 for the second device 121b (e.g., during the same masked implantation process) (see FIG. 10). Additionally, during a separate masked implantation process (e.g., either before or after formation of the first and second diffusion regions 221, 222), a third diffusion region 223 can be formed in the semiconductor layer 208 such that it is positioned laterally between the first diffusion region 221 and the second diffusion region 222, such that it has the second conductivity type and further such that it extends vertically to the floating section 205 of the well 102. Next, a conductor layer 260 can be formed on the semiconductor layer 208 such that it extends laterally over and contacts the first diffusion region 221, the third diffusion region 223 and the second diffusion region 222 (414). For example, a silicide conductor layer 260 can be formed using conventional processing techniques. That is, a metal, such as titanium, platinum, or cobalt, can be deposited onto the epitaxial silicon layer 208 by a technique such as sputtering or evaporation. The structure is then heated to a temperature of about 900°-1000° C. so that metal in contact with silicon will react to form metal silicide. Then, any unreacted metal (e.g., metal found on surfaces other than silicon) can be chemically removed. The conductor layer 260 in combination with the third diffusion region 223 form a junction 250 between the first diffusion region 221, the underlying floating well section 205 and the second diffusion region 222. That is, the third diffusion region 223 in combination with the conductor layer 260 form a structure that electrically connects (i.e., links, couples, etc.) the diffusion regions 221 and 222 of the adjacent devices 121a and 121b and also the underlying floating well section 205.

Subsequently, additional processing is performed in order to complete the integrated circuit device structure 100 (416). Additional processing steps can include, but are not limited to, interlayer dielectric deposition and contact formation. Specifically, a shared single contact 280 can be formed on the conductor layer 260 in order to electrically connect the diffusion regions 221 and 222 of the adjacent first and second devices 121a and 121b and also the underlying floating well section 205 to a supply voltage (e.g., Vdd) (418, see FIG. 2). This shared contact 280 eliminates the cost and area penalties that would be incurred if a discrete supply voltage contact was required for each floating well section.

Referring again to FIG. 4, one exemplary embodiment of this method can comprise forming a static random access memory (SRAM) array 100, as illustrated in FIG. 1. This embodiment can similarly comprise providing a substrate 101, having a first conductivity type (e.g., a P− semiconductor substrate) (402). Wells 102, having a second conductivity type (e.g., N+ wells), and, optionally, wells 103, having the first conductivity type (e.g., P+ wells), can be formed at the top surface of the substrate 101 (404, see FIG. 5). For example, wells 102 and wells 103 can be implanted into the substrate 101 using conventional masked implantation techniques such that well 102, having the second conductivity type, is positioned between wells 103, having the first conductivity type. Then, after the wells 102 and 103 are formed, a semiconductor layer 208 is formed on the substrate 101 (e.g., by epitaxially growing a silicon layer) (406, see FIG. 6). Optionally, at this point in the processing additional wells can be formed (i.e., implanted) in the semiconductor layer 208 at the semiconductor layer-substrate interface. For example, wells having the second conductivity type (e.g., N− wells) can be implanted into the semiconductor layer 208 above the wells 102.

Next, deep trench isolation regions 150 and 160 can be formed that extend through the semiconductor layer 208 and down into the substrate 101 below the maximum depth of the wells 102 and 103 in order to provide all required inter-well and intra-well isolation for the SRAM array 100, thereby defining device regions in the semiconductor layer 208: one specific device region 200 being a designated region above the well 102 for a first pull-up field effect transistor 121a for a first memory cell 110a and a second pull-up field effect transistor 121b for a second adjacent memory cell 110b (408). Such deep trench isolation regions 150, 160 can be formed using conventional techniques. For example, a photoresist layer can be deposited onto the semiconductor layer 208 and patterned. The pattern can then be transferred into the semiconductor layer 208 and substrate 101 using an anisotropic etch process (e.g., a plasma reactive ion etch (RIE) process) to form the trenches 760 (see FIG. 7). The anisotropic etch is continued until the trenches 760 are deeper than the maximum depth 206 of the well 102. After the trenches 760 are formed, they can optionally be lined (e.g., by growing a thin oxide material), filled (e.g., by plasma deposition) with one or more non-electrically conductive fill material (e.g., an oxide fill material, a nitride fill material, an oxynitride fill material, etc.) and then planarized, thereby creating the DTI regions (e.g., see FIG. 8).

Once the device regions are defined, all devices for the SRAM array 100 can be formed (410). Specifically, first conductivity type devices 105 (e.g., pull-up FETs 121) can be formed above the second conductivity type well 102 and second conductivity type devices 104 (e.g., pull-down FETs 122 and pass-gate FETs 123) can be formed above the first conductivity type wells 103 (as shown in FIG. 1). However, during device formation at process 410 and in the case of a device region 200 having an underlying floating well section 205 created by the DTI regions 150, 160 (e.g., see FIG. 8), a junction can also be formed between the source regions of the pull-up FETs of adjacent memory cells and the underlying floating well section. This junction, as formed, can comprise a structure which allows a supply voltage to be simultaneously applied, through the shared contact, to the source regions of the adjacent pull-up FETs and to the underlying floating well section.

Specifically, conventional processing techniques can be used to form the devices 105 (e.g., the pull-up FETs 121) and the devices 104 (e.g., the pull-down FETs 122 and pass-gate FETs 123) in the various device regions and, more particularly, to form the first pull-up field effect transistor 121a and the second pull-up field effect transistor 121b in the specific device region 200. That is, a blanket gate dielectric layer can be deposited on the semiconductor layer and a blanket gate conductor layer can be deposited on the gate dielectric layer. The gate dielectric layer-gate conductor layer stack can be patterned and etched to form gate structures, including but not limited to, gate structures 901 and 902 for adjacent devices 121a and 121b in device region 200 (see FIG. 9). Then, first source/drain regions 221, having the first conductivity type, can be formed in the semiconductor layer 208 on either side of the first gate structure 901 for the first pull-up FET 121a (e.g., by performing a masked implantation process). Simultaneously, second source/drain regions 222, also having the first conductivity type, can be formed in the semiconductor layer 208 on either side of the second gate structure 902 for the second pull-up FET 121b (e.g., during the same masked implantation process (see FIG. 10). Additionally, during a separate masked implantation process (e.g., either before or after formation of the first and second source/drain regions 221, 222), an additional doped region 223 can be formed in the semiconductor layer 208 such that it is positioned laterally between a first source region 221 of the first pull-up FET 121a and a second source region 222 of the second pull-up FET 121b, such that it has the second conductivity type and further such that it extends vertically to the floating section 205 of the well 102. Next, a conductor layer 260 can be formed on the semiconductor layer 208 such that the conductor layer 260 extends laterally over and contacts the first source region 221, the doped region 223 and the second source region 222 (414). For example, a silicide conductor layer 260 can be formed using conventional processing techniques. That is, a metal, such as titanium, platinum, or cobalt, can be deposited onto the epitaxial silicon layer 208 by a technique such as sputtering or evaporation. The structure is then heated to a temperature of about 900°-1000° C. so that metal in contact with silicon will react to form metal silicide. Then, any unreacted metal (e.g., metal found on surfaces other than silicon) can be chemically removed. The conductor layer 260 in combination with the doped region 223 form a junction 250 between the first source region 221, the underlying floating well section 205 and the second source region 222. That is, the doped region 223 in combination with the conductor layer 260 form a structure that electrically connects (i.e., links, couples, etc.) the source regions 221, 222 of the adjacent pull-up FETs 121a, 121b and also the underlying floating well section 205.

Subsequently, additional processing can be performed in order to complete the integrated circuit device structure 100 (416). Additional processing steps can include, but are not limited to, interlayer dielectric deposition and contact formation. Specifically, a shared single contact 280 can be formed on the conductor layer 260 in order to electrically connect the source regions 221, 222 of the adjacent pull-up FETs devices 121a and 121b and also the underlying floating well section 205 to a positive supply voltage (e.g., Vdd) (418, see FIG. 2). This shared contact 280 eliminates the cost and area penalties that would be incurred if a discrete supply voltage contact was required for each floating well section.

It should be noted that, since bulk wafers typically have a P-conductivity type, "the first conductivity type" referred to above will typically comprise a P-type conductivity and the "second conductivity type" referred to above will typically comprise an N-type conductivity. However, it is anticipated that, in the alternative, the first conductivity type could comprise an N-type conductivity and the second conductivity type could comprise a P-type conductivity. Those skilled in the art will recognize that P-type and N-type conductivity can be achieved at processes 404 and 412, as discussed above, through implantation of appropriately selected dopants. For example, P-type diffusion and well regions can be implanted with a Group III dopant, such as boron (B), whereas N-type diffusion and well regions can be implanted with a Group V dopant, such as arsenic (As), phosphorous (P) or antimony (Sb).

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an improved integrated circuit device structure (e.g., a static random access memory (SRAM) array structure or other integrated circuit device structure incorporating both P-type and N-type devices) and a method of forming the structure that uses deep trench isolation (DTI) regions for all inter-well and intra-well isolation and, thereby provides a low-cost isolation scheme that avoids FET width variations due to shallow trench isolation (STI)-DTI misalignment. Furthermore, because the DTI regions used for intra-well isolation effectively create some floating well sections (i.e., isolated well sections), which must each be connected to a supply voltage (e.g., Vdd) to prevent threshold voltage (Vt) variations, the disclosed integrated circuit device also includes a shared contact to a junction between the diffusion regions of adjacent devices and an underlying floating well. This shared contact eliminates the cost and area penalties that would be incurred if a discrete supply voltage contact was required for each floating well section.

What is claimed is:

1. An integrated circuit device structure comprising:
    a substrate having a first conductivity type;

a well in said substrate, said well having a second conductivity type different from said first conductivity type;
on said substrate above said well, a semiconductor layer comprising:
a first diffusion region of a first device;
a second diffusion region of a second device, said first diffusion region and said second diffusion region each having said first conductivity type; and
a third diffusion region positioned laterally between said first diffusion region and said second diffusion region, said third diffusion region having said second conductivity type and further extending vertically to said well;
a conductor layer on said semiconductor layer, said conductor layer extending laterally over and contacting said first diffusion region, said third diffusion region and said second diffusion region.

2. The integrated circuit device structure of claim 1, said semiconductor layer comprising a device region above said well, said device region containing said first device and said second device and being defined on opposing sides and opposing ends by deep trench isolation regions extending into said substrate below said well.

3. The integrated circuit device structure of claim 1, further comprising a contact on said conductor layer, said contact being connected to a supply voltage.

4. The integrated circuit device structure of claim 1, said first conductivity type comprising a P-type conductivity and said second conductivity comprising an N-type conductivity.

5. The integrated circuit device structure of claim 1, said conductor layer comprising a silicide layer.

6. The integrated circuit device structure of claim 1, said semiconductor layer comprising an epitaxial silicon layer.

7. A static random access memory (SRAM) array structure comprising:
a substrate having a first conductivity type;
a well in said substrate, said well having a second conductivity type different from said first conductivity type;
on said substrate above said well, a semiconductor layer comprising:
a first source region for a first pull-up field effect transistor of a first memory cell;
a second source region for a second pull-up field effect transistor for a second memory cell, said first source region and said second source region having said first conductivity type; and
a doped region positioned laterally between said first source region and said second source region, said doped region having said second conductivity type and further extending vertically to said well; and
a conductor layer on said semiconductor layer, said conductor layer extending laterally over and contacting said first source region, said doped region and said second source region.

8. The static random access memory (SRAM) array structure of claim 7, said semiconductor layer comprising a device region above said well, said device region containing said first pull-up field effect transistor and said second pull-up field effect transistor and being defined on opposing sides and opposing ends by deep trench isolation regions extending into said substrate below said well.

9. The static random access memory (SRAM) array structure of claim 7, further comprising a contact on said conductor layer, said contact being connected to a positive supply voltage (Vdd).

10. The static random access memory (SRAM) array structure of claim 7, said first conductivity type comprising a P-type conductivity and said second conductivity comprising an N-type conductivity.

11. The static random access memory (SRAM) array structure of claim 7, said conductor layer comprising a silicide layer.

12. The static random access memory (SRAM) array structure of claim 7, said semiconductor layer comprising an epitaxial silicon layer.

13. A static random access memory (SRAM) array structure comprising:
a P− substrate;
an N+ well in said substrate;
a semiconductor layer on said substrate;
deep trench isolation regions extending through said semiconductor layer into said substrate to below said N+ well so as to define device regions of memory cells in said array, one of said device regions comprising:
a section of said semiconductor layer above a section of said N+ well, said section of said semiconductor layer comprising:
a first P-type source region for a first P-type pull-up field effect transistor of a first memory cell;
a second P-type source region for a second P-type pull-up field effect transistor of a second memory cell adjacent to said first memory cell; and
an N-type doped region positioned laterally between said first P-type source region and said second P-type source region, said N-type doped region further extending vertically to said section of said N+ well;
a conductor layer on said semiconductor layer, said conductor layer extending laterally over and contacting said first P-type source region, said N-type doped region and said second P-type source region; and
a contact on said conductor layer, said contact being connected to a positive supply voltage (Vdd).

14. A method of forming an integrated circuit device structure, said method comprising:
providing a substrate having a first conductivity type;
forming a well in said substrate, said well having a second conductivity type different from said first conductivity type;
after said forming of said well, forming a semiconductor layer on said substrate; and
forming a junction between said well, a first diffusion region of a first device and a second diffusion region of a second device, said forming of said junction comprising:
forming, in said semiconductor layer, said first diffusion region and said second diffusion region such that said first diffusion region and said second diffusion region have said first conductivity type;
forming, in said semiconductor layer, a third diffusion region positioned laterally between said first diffusion region and said second diffusion region such that said third diffusion region has said second conductivity type and extends vertically to said well; and
forming a conductor layer on said semiconductor layer such that said conductor layer extends laterally over and contacts said first diffusion region, said third diffusion region and said second diffusion region.

15. The method of claim 14, further comprising,
before said forming of said junction, forming deep trench isolation regions extending into said substrate to below said well in order to define device regions in said semiconductor layer, one of said device regions comprising a designated region above said well for said first device and said second device.

16. The method of claim 14, further comprising forming a contact to said conductor layer and electrically connecting said contact to a supply voltage.

17. The method of claim 14, said first conductivity type comprising a P-type conductivity and said second conductivity comprising an N-type conductivity.

18. The method of claim 14, said forming of said conductor layer comprising forming a silicide layer.

19. The method of claim 14, said forming of said semiconductor layer comprising epitaxially growing a silicon layer.

20. A method of forming a static random access memory (SRAM) array structure, said method comprising:
   providing a a substrate having a first conductivity type;
   forming a well in said substrate, said well having a second conductivity type different from said first conductivity type;
   after said forming of said well, forming a semiconductor layer on said substrate;
   forming a junction between said well and a first source region of a first pull-up field effect transistor of a first memory cell and a second source region of a second pull-up field effect transistor of a second memory cell, said forming of said junction comprising:
      forming, in said semiconductor layer, said first source region for said first pull-up field effect transistor and said second source region for said second pull-up field effect transistor such that said first source region and said second source region have said first conductivity type;
      forming, in said semiconductor layer, a doped region positioned laterally between said first source region and said second source region such that said doped region has said second conductivity type and extends vertically to said well; and
      forming a conductor layer on said semiconductor layer such that said conductor layer extends laterally over and contacts said first source region, said doped region and said second source region.

21. The method of claim 20,
   before said forming of said junction, forming deep trench isolation regions extending into said substrate to below said well in order to define device regions in said semiconductor layer, one of said device regions comprising a designated region above said well for said first pull-up field effect transistor and said second pull-up field effect transistor.

22. The method of claim 20, forming a contact to said conductor layer and electrically connecting said contact to a positive supply voltage (Vdd).

23. The method of claim 20, said first conductivity type comprising a P-type conductivity and said second conductivity comprising an N-type conductivity.

24. The method of claim 20, said forming of said conductor layer comprising forming a silicide layer.

25. The method of claim 20, said forming of said semiconductor layer comprising epitaxially growing a silicon layer.

* * * * *